(12) United States Patent
Hoogenraad

(10) Patent No.: US 7,756,660 B2
(45) Date of Patent: *Jul. 13, 2010

(54) LITHOGRAPHIC APPARATUS AND DEVICE MANUFACTURING METHOD

(75) Inventor: Johannes Herman Hoogenraad, Houten (NL)

(73) Assignee: ASML Netherlands B.V., Veldhoven (NL)

( * ) Notice: Subject to any disclaimer, the term of this patent is extended or adjusted under 35 U.S.C. 154(b) by 0 days.

This patent is subject to a terminal disclaimer.

(21) Appl. No.: 11/022,921

(22) Filed: Dec. 28, 2004

(65) Prior Publication Data

US 2006/0139601 A1 Jun. 29, 2006

(51) Int. Cl.
*G01C 17/38* (2006.01)
(52) U.S. Cl. .................................................. 702/94
(58) Field of Classification Search .................. 702/94, 702/95, 150–153, 158, 159, 170, 172
See application file for complete search history.

(56) References Cited

U.S. PATENT DOCUMENTS

| | | | |
|---|---|---|---|
| 5,229,872 A | 7/1993 | Mumola | 349/2 |
| 5,296,891 A | 3/1994 | Vogt et al. | 355/67 |
| 5,500,736 A | 3/1996 | Koitabashi et al. | 356/620 |
| 5,523,193 A | 6/1996 | Nelson | 430/311 |
| 5,530,482 A | 6/1996 | Gove et al. | 348/441 |
| 5,579,147 A | 11/1996 | Mori et al. | 359/204 |
| 5,677,703 A | 10/1997 | Bhuva et al. | 345/84 |
| 5,808,797 A | 9/1998 | Bloom et al. | 359/572 |
| 5,982,553 A | 11/1999 | Bloom et al. | 359/627 |
| 6,133,986 A | 10/2000 | Johnson | 355/67 |
| 6,177,980 B1 | 1/2001 | Johnson | 355/67 |
| 6,624,943 B2* | 9/2003 | Nakai et al. | 359/569 |
| 6,687,041 B1 | 2/2004 | Sandstrom | 359/291 |
| 6,747,783 B1 | 6/2004 | Sandstrom | 359/290 |
| 6,795,164 B2* | 9/2004 | Hoogenraad et al. | 355/53 |
| 6,795,169 B2 | 9/2004 | Tanaka et al. | 355/67 |
| 6,806,897 B2 | 10/2004 | Kataoka et al. | 347/256 |
| 6,811,953 B2 | 11/2004 | Hatada et al. | 430/311 |
| 7,061,591 B2 | 6/2006 | Bleeker et al. | |
| 7,068,432 B2* | 6/2006 | Boettiger et al. | 359/619 |
| 7,081,947 B2* | 7/2006 | Gui et al. | 355/55 |
| 7,116,404 B2* | 10/2006 | Lof et al. | 355/67 |
| 7,274,029 B2* | 9/2007 | Lof et al. | 250/492.22 |
| 7,324,186 B2 | 1/2008 | Gui et al. | |
| 2002/0181836 A1 | 12/2002 | Lemoff | |

(Continued)

FOREIGN PATENT DOCUMENTS

EP    1 569 035    *    8/2005

(Continued)

OTHER PUBLICATIONS

English Abstract of JP 5-236216. 9-1993.*

(Continued)

*Primary Examiner*—Michael P Nghiem
(74) *Attorney, Agent, or Firm*—Sterne, Kessler, Goldstein & Fox P.L.L.C.

(57) ABSTRACT

A lithographic apparatus has an array of individually controllable elements to impart a projection beam with a pattern in its cross-section. The projection system includes an array of lenses and an actuator configured to change the shape of the array of lenses. In one example, the actuator is a piezoelectric actuator

5 Claims, 4 Drawing Sheets

U.S. PATENT DOCUMENTS

| | | | |
|---|---|---|---|
| 2003/0122956 A1 | 7/2003 | Sugimoto et al. | |
| 2004/0041104 A1 | 3/2004 | Liebregts et al. | 250/492.22 |
| 2004/0130561 A1 | 7/2004 | Jain | 345/694 |
| 2005/0007572 A1 | 1/2005 | George et al. | 355/55 |
| 2005/0127786 A1* | 6/2005 | Hendriks et al. | 310/328 |
| 2005/0190353 A1* | 9/2005 | Gui et al. | 355/55 |
| 2005/0243298 A1* | 11/2005 | de Jager et al. | 355/67 |
| 2006/0139585 A1* | 6/2006 | Maria Van Der Wijst et al. | 355/52 |

FOREIGN PATENT DOCUMENTS

| | | |
|---|---|---|
| JP | 5-236216 A | 9/1993 |
| JP | 2003-075737 A | 3/2003 |
| JP | 2003-198952 A | 7/2003 |
| JP | 2004-363598 A | 12/2004 |
| JP | 2005-244238 A | 9/2005 |
| WO | WO 97/34171 A2 | 9/1997 |
| WO | WO 98/33096 | 7/1998 |
| WO | WO 98/38597 | 9/1998 |
| WO | WO 03/040830 A2 | 5/2003 |

OTHER PUBLICATIONS

Office Action and Translation of Office Action for Japanese Patent Application No. 2005-364262 mailed Oct. 14, 2008, 4 pgs.

English abstract for JP 2001-500628 T published Jan. 16, 2001, 1 pg.

Notification of Reasons for Refusal in Japanese Application No. 2005-364262 mailed May 26, 2009, 2 pgs.

* cited by examiner

LITHOGRAPHIC APPARATUS AND DEVICE MANUFACTURING METHOD

BACKGROUND

1. Field of the Invention

The present invention relates to a lithographic apparatus and a device manufacturing method.

2. Related Art

A lithographic apparatus is a machine that applies a desired pattern onto a target portion of a substrate. Lithographic apparatus can be used, for example, in the manufacture of integrated circuits (ICs), flat panel displays, and other devices involving fine structures. In a conventional lithographic apparatus, a patterning device, which is alternatively referred to as a mask or a reticle, can be used to generate a circuit pattern corresponding to an individual layer of the IC (or other device), and this pattern can be imaged onto a target portion (e.g., comprising part of, one or several dies) on a substrate (e.g., a silicon wafer or glass plate) that has a layer of radiation-sensitive material (e.g., resist). Instead of a mask, the patterning device can comprise an array of individually controllable elements that serve to generate the circuit pattern. This is known as a maskless lithographic apparatus.

An array of lenses can be arranged perpendicularly to the direction of propagation of the projection beam, each lens transmitting and focusing a unique part of the projection beam onto the substrate. This is known as a micro lens array (MLA).

In general, a single substrate will contain a network of adjacent target portions that are successively exposed. Known lithographic apparatus include steppers, in which each target portion is irradiated by exposing an entire pattern onto the target portion in one go, and scanners, in which each target portion is irradiated by scanning the pattern through the projection beam in a given direction (the "scanning" direction), while synchronously scanning the substrate parallel or anti-parallel to this direction.

When exposing substrates it is important that the patterned projection beam is accurately focused onto the substrate. Changes in the thickness or warping of the substrate can lead to inaccuracies in the exposure of substrate. This has conventionally been remedied using actuators to adjust the height of the substrate. The disadvantage of this solution is that it is necessary to move or bend the entire substrate.

Maskless apparatus are often used in the manufacture of flat panel displays. Substrates used for flat panel displays are more flexible than conventional silicon substrates, and therefore more susceptible to deviation in the height of the surface on which the image is to be exposed. When exposing flat panel displays, it is also desirable to be able to change the image being exposed.

Therefore, what is needed is a system and method that provide an improved method of compensating for changes in thickness of a substrate.

SUMMARY

According to one embodiment of the present invention, there is provided lithographic apparatus comprising an illumination system, an array of individually controllable elements, and a projection system. The illumination system conditions a radiation beam. The array of individually controllable elements patterns the beam. The projection system projects the patterned beam onto a target portion of a substrate. The projection system comprises an array of lenses arranged in a plane and an actuator system. Each lens in the array of lenses transmits a different part of the patterned beam. The actuator system controls a shape of the array of lenses.

According to a further embodiment of the present invention, there is provided a device manufacturing method comprising the following steps. Patterning a beam of radiation using an array of individually controllable elements. Projecting the patterned beam onto a target portion of a substrate using at least an array of lenses arranged in a plane, such that each lens in the array of lenses transmits a different part of the radiation beam. Setting the array of lenses to a required shape using an actuator system that controls a shape of the array of lenses.

Further embodiments, features, and advantages of the present invention, as well as the structure and operation of the various embodiments of the present invention, are described in detail below with reference to the accompanying drawings.

BRIEF DESCRIPTION OF THE DRAWINGS/FIGURES

The accompanying drawings, that are incorporated herein and form a part of the specification, illustrate the present invention and, together with the description, further serve to explain the principles of the invention and to enable a person skilled in the pertinent art to make and use the invention.

FIG. 1 depicts a lithographic apparatus, according to one embodiment of the present invention.

FIGS. 2, 3, 4A, 4B, 4C, and 5 show various arrangements of actuators, according to various embodiments of the present invention.

FIGS. 6 and 7 depict details of a lithographic, according to various embodiments of the present invention.

The present invention will now be described with reference to the accompanying drawings. In the drawings, like reference numbers can indicate identical or functionally similar elements.

DETAILED DESCRIPTION

Overview and Terminology

Although specific reference can be made in this text to the use of lithographic apparatus in the manufacture of integrated circuits (ICs), it should be understood that the lithographic apparatus described herein can have other applications, such as the manufacture of the manufacture of DNA chips, MEMS, MOEMS, integrated optical systems, guidance and detection patterns for magnetic domain memories, flat panel displays, thin-film magnetic heads, micro and macro fluidic devices, etc. The skilled artisan will appreciate that, in the context of such alternative applications, any use of the terms "wafer" or "die" herein can be considered as synonymous with the more general terms "substrate" or "target portion," respectively. The substrate referred to herein can be processed, before or after exposure, in, for example, a track (e.g., a tool that typically applies a layer of resist to a substrate and develops the exposed resist) or a metrology or inspection tool. Where applicable, the disclosure herein can be applied to such and other substrate processing tools. Further, the substrate can be processed more than once, for example, in order to create a multi-layer IC, so that the term substrate used herein can also refer to a substrate that already contains multiple processed layers.

The term "array of individually controllable elements" as here employed should be broadly interpreted as referring to any device that can be used to endow an incoming radiation beam with a patterned cross-section, so that a desired pattern can be created in a target portion of the substrate. The terms "light valve" and "Spatial Light Modulator" (SLM) can also be used in this context. Examples of such patterning devices are discussed below.

A programmable mirror array can comprise a matrix-addressable surface having a viscoelastic control layer and a reflective surface. The basic principle behind such an apparatus is that, for example, addressed areas of the reflective surface reflect incident light as diffracted light, whereas unaddressed areas reflect incident light as undiffracted light.

Using an appropriate spatial filter, the filter can filter out the diffracted light, leaving the undiffracted light to reach the substrate. In this manner, the beam becomes patterned according to the addressing pattern of the matrix-addressable surface. It will be appreciated that, as an alternative, the undiffracted light can be filtered out of the reflected beam, leaving only the diffracted light to reach the substrate. An array of diffractive optical micro electrical mechanical system (MEMS) devices can also be used in a corresponding manner. Each diffractive optical MEMS device can include a plurality of reflective ribbons that can be deformed relative to one another to form a grating that reflects incident light as diffracted light.

A further alternative embodiment can include a programmable mirror array employing a matrix arrangement of tiny mirrors, each of which can be individually tilted about an axis by applying a suitable localized electric field, or by employing piezoelectric actuation means. Once again, the mirrors are matrix-addressable, such that addressed mirrors will reflect an incoming radiation beam in a different direction to unaddressed mirrors; in this manner, the reflected beam is patterned according to the addressing pattern of the matrix-addressable mirrors. The required matrix addressing can be performed using suitable electronic means.

In both of the situations described here above, the array of individually controllable elements can comprise one or more programmable mirror arrays. A programmable LCD array can also be used. It should be appreciated that where pre-biasing of features, optical proximity correction features, phase variation techniques and multiple exposure techniques are used, for example, the pattern "displayed" on the array of individually controllable elements can differ substantially from the pattern eventually transferred to a layer of or on the substrate. Similarly, the pattern eventually generated on the substrate can not correspond to the pattern formed at any one instant on the array of individually controllable elements. This can be the case in an arrangement in which the eventual pattern formed on each part of the substrate is built up over a given period of time or a given number of exposures during which the pattern on the array of individually controllable elements and/or the relative position of the substrate changes.

The terms "radiation" and "beam" used herein encompass all types of electromagnetic radiation, including ultraviolet (UV) radiation (e.g., having a wavelength of 365, 355, 248, 193, 157 or 126 nm) and extreme ultra-violet (EUV) radiation (e.g., having a wavelength in the range of 5-20 nm), as well as particle beams, such as ion beams or electron beams.

The term "projection system" used herein should be broadly interpreted as encompassing various types of projection systems, including refractive optical systems, reflective optical systems, and catadioptric optical systems, as appropriate, for example, for the exposure radiation being used, or for other factors such as the use of an immersion fluid or the use of a vacuum. Any use of the term "lens" herein can be considered as synonymous with the more general term "projection system."

The illumination system can also encompass various types of optical components, including refractive, reflective, and catadioptric optical components for directing, shaping, or controlling the beam of radiation, and such components can also be referred to below, collectively or singularly, as a "lens."

The lithographic apparatus can be of a type having two (e.g., dual stage) or more substrate tables (and/or two or more mask tables). In such "multiple stage" machines the additional tables can be used in parallel, or preparatory steps can be carried out on one or more tables while one or more other tables are being used for exposure.

The lithographic apparatus can also be of a type wherein the substrate is immersed in a liquid having a relatively high refractive index (e.g., water), so as to fill a space between the final element of the projection system and the substrate. Immersion liquids can also be applied to other spaces in the lithographic apparatus, for example, between the substrate and the first element of the projection system. Immersion techniques are well known in the art for increasing the numerical aperture of projection systems.

Further, the apparatus can be provided with a fluid processing cell to allow interactions between a fluid and irradiated parts of the substrate (e.g., to selectively attach chemicals to the substrate or to selectively modify the surface structure of the substrate).

Exemplary Lithographic Projection Tools

FIG. 1 schematically depicts a lithographic projection apparatus 1, according to one embodiment of the present invention. The apparatus comprises an illumination system IL, an array of individually controllable elements PPM, a substrate table WT, and a projection system ("lens") PL. The illumination system (e.g., illuminator) IL provides a projection beam PB of radiation (e.g., UV radiation). The array of individually controllable elements PPM (e.g., a programmable mirror array) applies a pattern to the projection beam; in general the position of the array of individually controllable elements will be fixed relative to item PL. However, it can instead be connected to a positioning means for accurately positioning it with respect to item PL. The substrate table (e.g., a wafer table) WT for supporting a substrate (e.g., a resist-coated glass or wafer) W, and connected to positioning means PW for accurately positioning the substrate with respect to item PL. The projection system ("lens") PL images a pattern imparted to the projection beam PB by the array of individually controllable elements PPM onto a target portion C (e.g., comprising one or more dies) of the substrate W. The projection system can image the array of individually controllable elements onto the substrate. Alternatively, the projection system can image secondary sources for which the elements of the array of individually controllable elements act as shutters.

As here depicted, the apparatus is of a reflective type (i.e., has a reflective array of individually controllable elements). However, in general, it can also be of a transmissive type, for example with a transmissive array of individually controllable elements.

The illuminator IL receives a beam of radiation from a radiation source SO. The source and the lithographic apparatus can be separate entities. In such cases, the source is not considered to form part of the lithographic apparatus and the radiation beam is passed from the source SO to the illuminator IL with the aid of a beam delivery system BD comprising for example suitable directing mirrors and/or a beam expander. In other cases the source can be integral part of the apparatus, for example when the source is a frequency tripled Nd:YAG laser. The source SO and the illuminator IL, together with the beam delivery system BD if required, can be referred to as a radiation system.

The illuminator IL can comprise adjusting means AM the for setting a zoom to adjust a spot size of beam or for adjusting angular intensity distribution of the beam. Generally, at least the outer and/or inner radial extent (commonly referred to as σ-outer and σ-inner, respectively) of the intensity distribution in a pupil plane of the illuminator can be adjusted. In addition, the illuminator IL generally comprises various other components, such as an integrator IN and a condenser CO. The illuminator provides a conditioned beam of radiation, referred to as the projection beam PB, having a desired zoom, spot size, uniformity, and intensity distribution in its cross section.

The beam PB subsequently intercepts the array of individually controllable elements PPM. Having been reflected by the array of individually controllable elements PPM, the beam PB passes through the projection system PL, which focuses the beam PB onto a target portion C of the substrate W. With the aid of the positioning means PW (and position measuring means, for example, interferometric measuring means IF on base plate BP), the substrate table WT can be moved accurately, e.g., so as to position different target portions C in the path of the beam PB. Where used, the positioning means for the array of individually controllable elements can be used to accurately correct the position of the array of individually controllable elements PPM with respect to the path of the beam PB, e.g., during a scan.

In general, movement of the object table WT is realized with the aid of a long-stroke module (course positioning) and a short-stroke module (fine positioning), which are not explicitly depicted in FIG. 1. A similar system can also be used to position the array of individually controllable elements.

It will be appreciated that the projection beam can alternatively/additionally be moveable, while the object table and/or the array of individually controllable elements can have a fixed position to provide the required relative movement.

As a further alternative, that can be especially applicable in the manufacture of flat panel displays, the position of the substrate table and the projection system can be fixed and the substrate can be arranged to be moved relative to the substrate table. For example, the substrate table can be provided with a system for scanning the substrate across it at a substantially constant velocity.

Although the lithography apparatus according to the invention is herein described as being for exposing a resist on a substrate, it will be appreciated that the invention is not limited to this use and the apparatus can be used to project a patterned projection beam for use in resistless lithography.

The depicted apparatus can be used in at least five modes:
1. Step mode: the array of individually controllable elements imparts an entire pattern to the projection beam, which is projected onto a target portion C in one go (i.e. a single static exposure). The substrate table WT is then shifted in the X and/or Y direction so that a different target portion C can be exposed. In step mode, the maximum size of the exposure field limits the size of the target portion C imaged in a single static exposure.
2. Scan mode: the array of individually controllable elements is movable in a given direction (the so-called "scan direction," e.g., the Y direction) with a speed v, so that the projection beam PB is caused to scan over the array of individually controllable elements; concurrently, the substrate table WT is simultaneously moved in the same or opposite direction at a speed V=Mv, in which M is the magnification of the lens PL. In scan mode, the maximum size of the exposure field limits the width (in the non-scanning direction) of the target portion in a single dynamic exposure, whereas the length of the scanning motion determines the height (in the scanning direction) of the target portion.
3. Pulse mode: the array of individually controllable elements is kept essentially stationary and the entire pattern is projected onto a target portion C of the substrate using a pulsed radiation source. The substrate table WT is moved with an essentially constant speed such that the projection beam PB is caused to scan a line across the substrate W. The pattern on the array of individually controllable elements is updated as required between pulses of the radiation system and the pulses are timed such that successive target portions C are exposed at the required locations on the substrate. Consequently, the projection beam can scan across the substrate W to expose the complete pattern for a strip of the substrate. The process is repeated until the complete substrate has been exposed line by line.
4. Continuous scan mode: essentially the same as pulse mode except that a substantially constant radiation source is used and the pattern on the array of individually controllable elements is updated as the projection beam scans across the substrate and exposes it.
5. Pixel Grid Imaging Mode: the pattern formed on a substrate is realized by subsequent exposure of spots formed by a spot generator that are directed onto an array of individually controllable elements. The exposed spots have substantially the same shape. On the substrate the spots are printed in substantially a grid. In one example, the spot size is larger than a pitch of a printed pixel grid, but much smaller than the exposure spot grid. By varying intensity of the spots printed, a pattern is realized. In between the exposure flashes the intensity distribution over the spots is varied.

Combinations and/or variations on the above described modes of use or entirely different modes of use can also be employed.

The projection system can also comprise an array of focusing elements, such as a microlens array (known as an MLA) or a Fresnel lens array. These arrays can be used to form secondary sources and to image microspots onto the substrate. In one example, each individually controllable element can have a corresponding lens in the MLA. In another example, the portion of the patterned beam from several individually controllable elements can be projected onto the substrate by a single lens in the MLA.

Changing the location of at least one lens with respect to other lenses within the MLA changes the focal point of a part of the projection beam PB. In various examples, this can be used to compensate for a change in thickness or a lack of smoothness of the substrate W or to change the image by stretching the MLA horizontally (e.g., perpendicular to the direction of propagation of the projection beam).

Exemplary Actuator Configurations

In various examples, to change the location of lenses in the MLA, either the whole MLA can be deformed or localized areas within the MLA can be deformed. To achieve this, actuators are positioned in or around the MLA. Piezoelectric actuators have been found to be particularly suitable due to their simplicity, cost and ease of use.

FIGS. 2, 3, 4A, 4B, 4C, and 5 show various arrangements of actuators, according to various embodiments of the present invention.

Figure 4A:
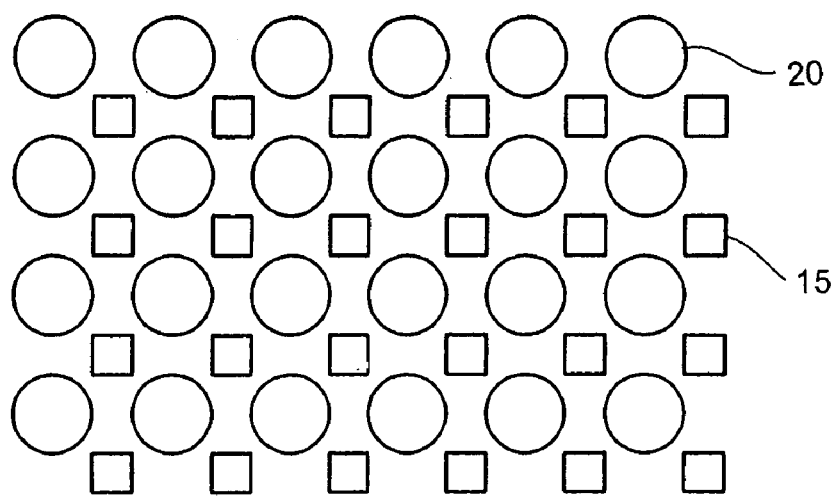

FIG. 4a shows a large number of piezoelectric actuators distributed throughout the MLA, according to one embodiment of the present invention. It is to be appreciated that there is no limit on the number of piezoelectric actuators 15. FIG. 4a shows each lens having a corresponding piezoelectric actuator.

Figure 4B:
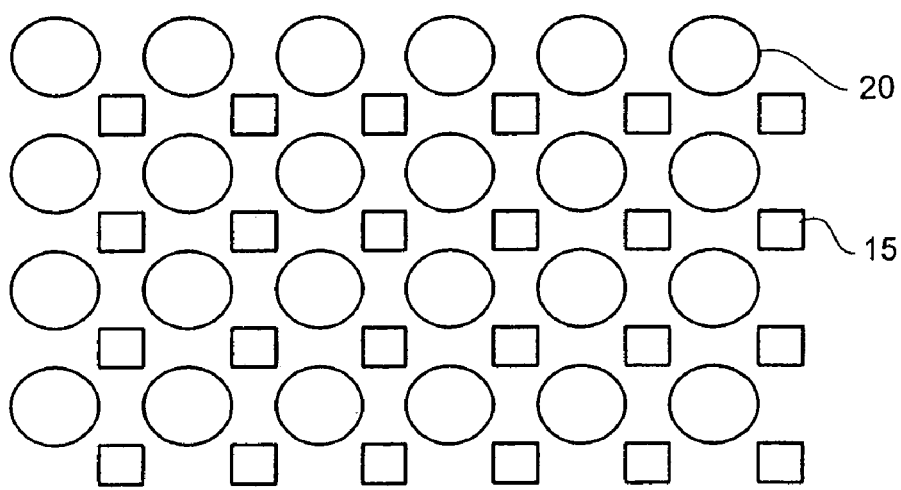
Figure 4C:
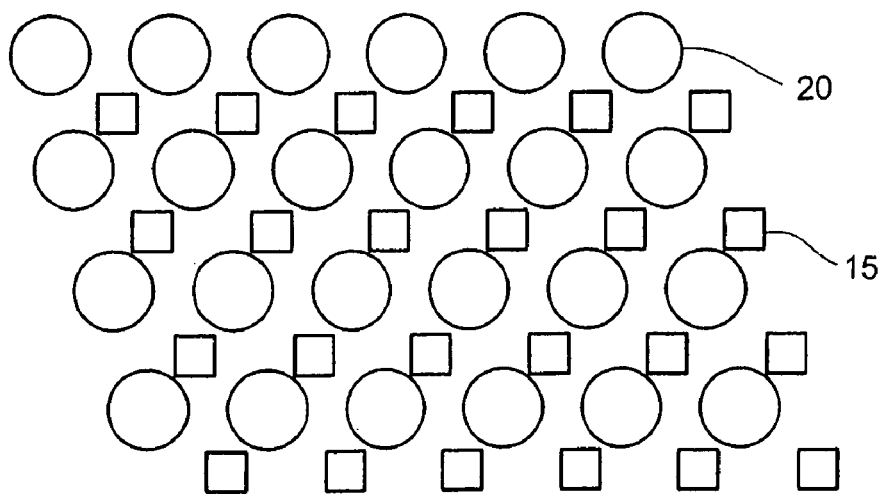

FIGS. 4b and 4c show piezoelectric actuators 15 used to stretch the MLA horizontally, according to various embodiments of the present invention. This can be used to change a magnification of the lithographic apparatus. This can also be used to change the magnification symmetrically, as shown in FIG. 4b, or asymmetrically, as shown in FIG. 4c.

The piezoelectric actuators can also deform the MLA vertically (i.e., parallel to the direction of propagation of the projection beam PB). This can be done either locally (i.e., only one or a small number of lenses) or across the entire MLA. In one example, changing the vertical position of the lenses changes the focal point of the corresponding part of the projection beam so it can be used to compensate for changes in the thickness of the substrate W. This can be used in addition to the horizontal stretching of the MLA described above.

Figure 1:
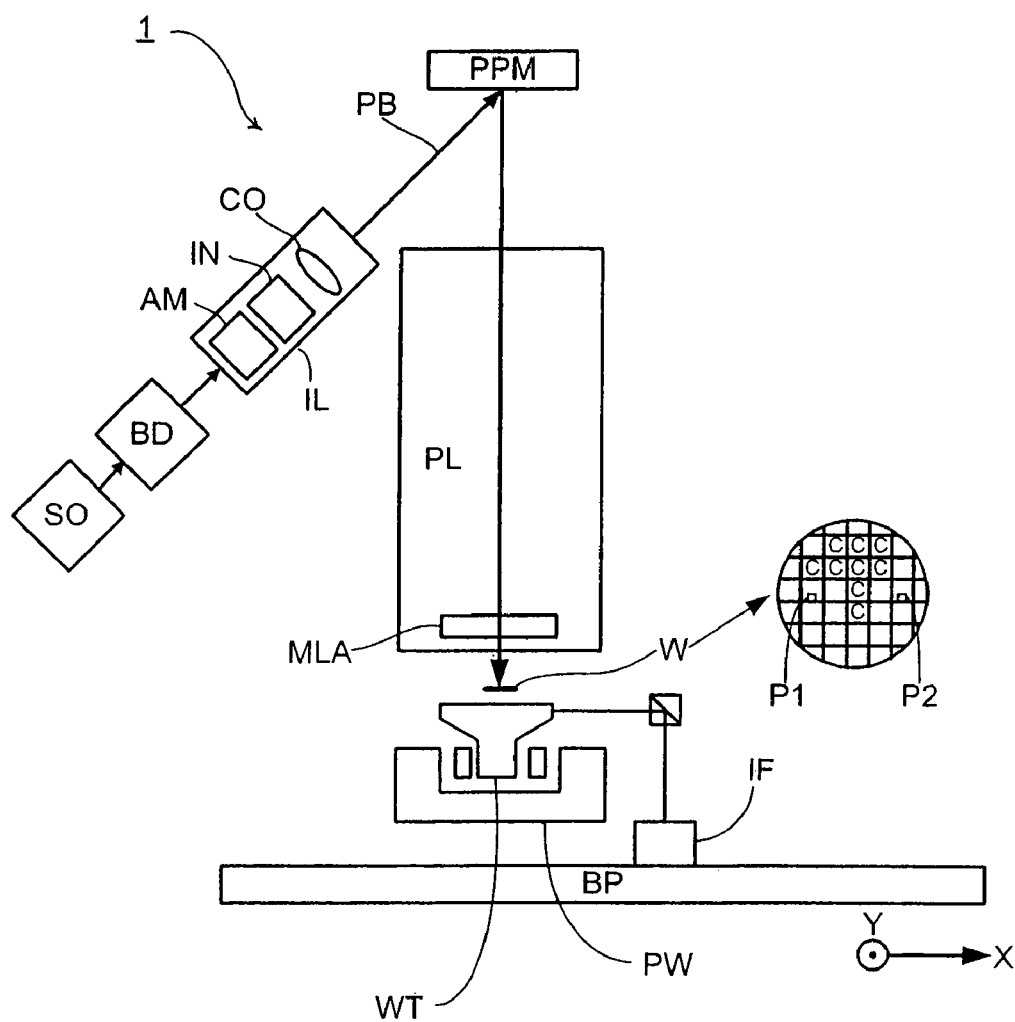
Figure 2:
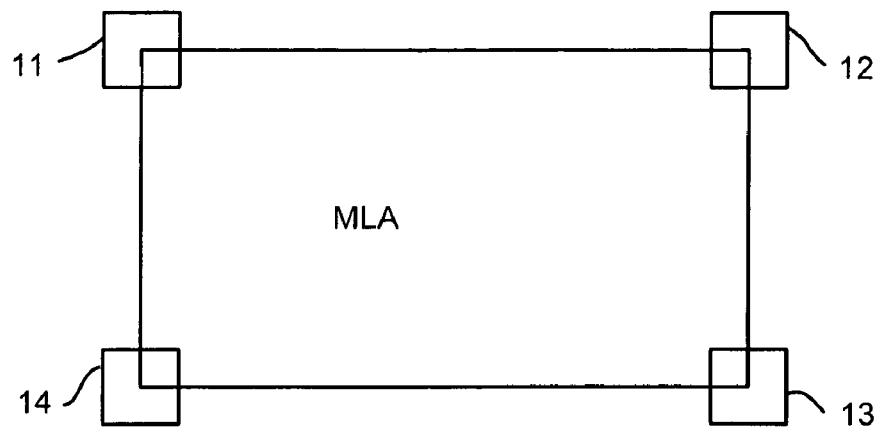
FIG. 2 shows four piezoelectric actuators 11, 12, 13, 14 positioned at corners of the MLA, according to one embodiment of the present invention.
Figure 3:
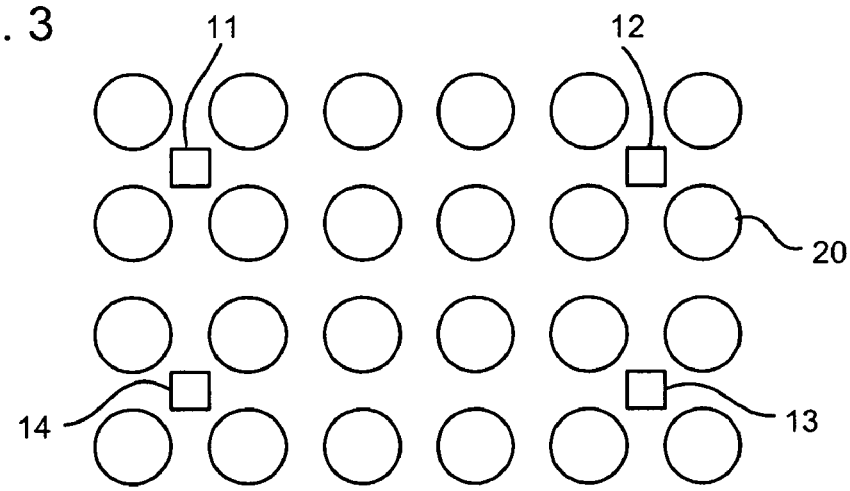
FIG. 3 shows four piezoelectric actuators 11, 12, 13, 14 positioned within the MLA between individual lenses 20.
Figure 5:
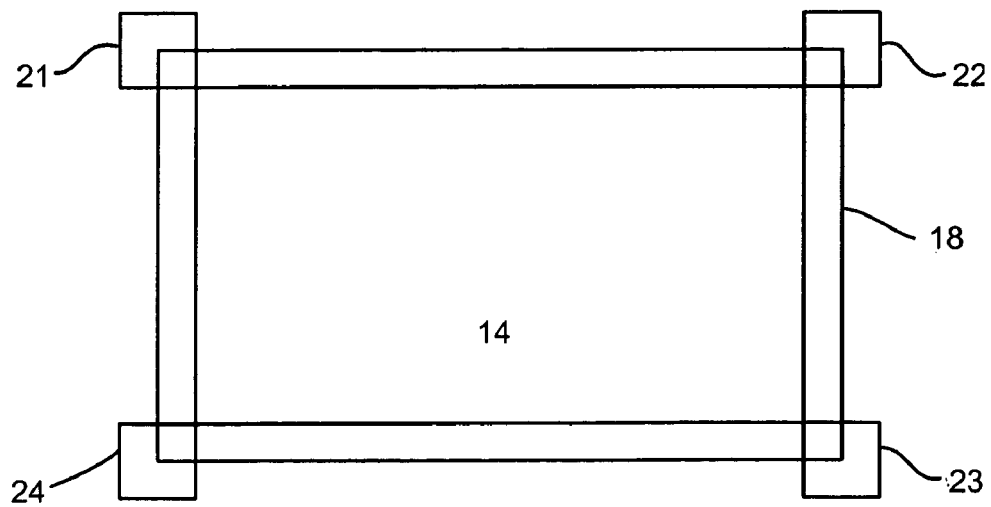

FIG. 5 shows an MLA mounted on a rigid frame 18 with actuators 21, 22, 23, 24 mounted on the frame, according to one embodiment of the present invention. In this example, actuator 21, 22, 23, and 24 are not necessarily piezoelectric actuators. The actuators 21, 22, 23, 24 can be used to deform the MLA relative to the frame 18.

In one or more of the embodiments described above, adjustments to the focal point of the projection beam PB can be achieved simply and cheaply relative to the conventional method of moving the entire substrate.

Exemplary Implementations

Figure 6:
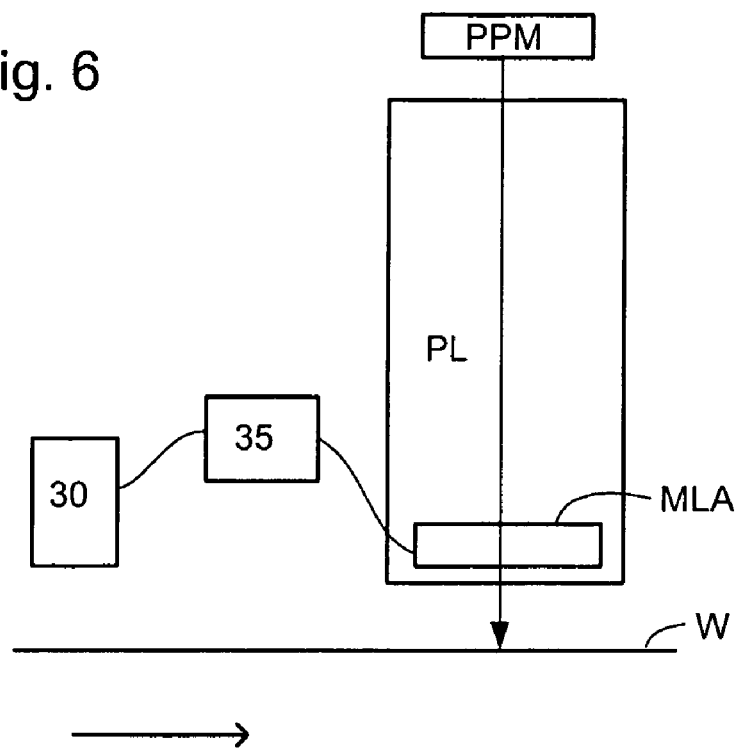

FIG. 6 shows an example of how one or more of the above embodiments and/or examples of the present invention can be implemented, according to one embodiment of the present invention. A camera 30 is positioned above a substrate W in the direction upstream of a projection system PL in the direction of travel of the substrate W. The camera 30 detects a height of a surface of the substrate W. This data is fed into controller 35, which controls actuators (not shown) in or around the MLA. When the camera 30 detects a change in height of the surface of the substrate W, the actuators can be activated to compensate for this change so the focal point of the projection beam PB remains on the upper surface of the substrate W.

Figure 7:
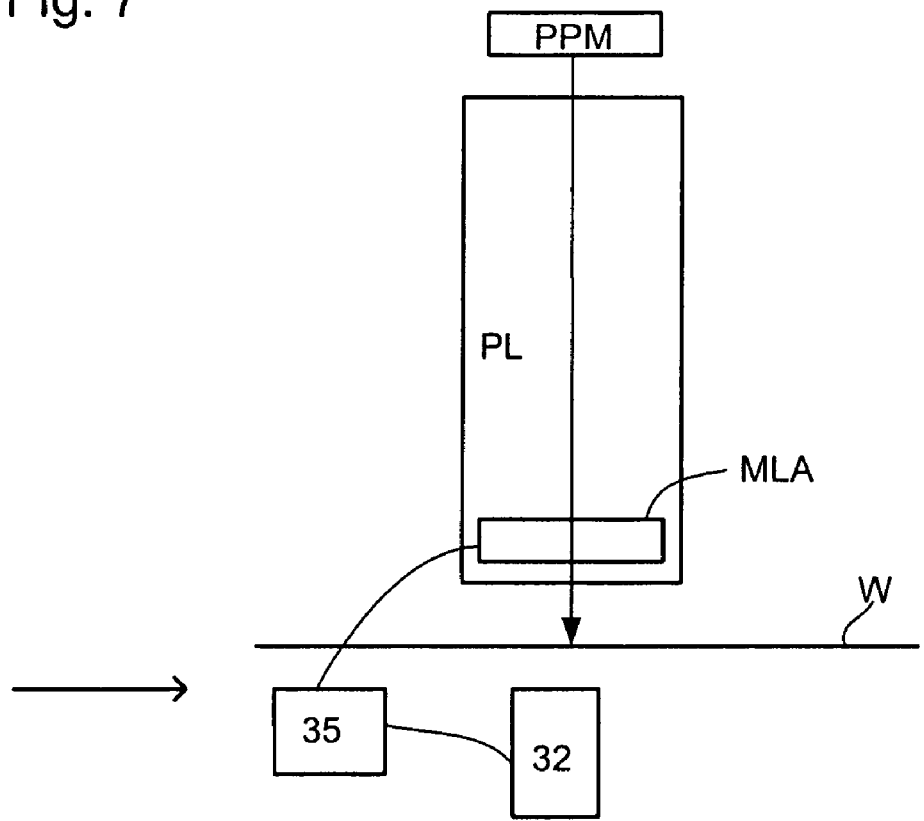

FIG. 7 shows an example of how one or more of the above embodiments and/or examples of the present invention can be implemented, according to one embodiment of the present invention. In one example, this arrangement is suitable for use with a substantially transparent substrate W, as a camera 32 is arranged beneath the substrate W. This detects a location of a surface of the substrate W and a controller 35 controls an actuator (not shown). The actuators compensate for the height of substrate W in real time.

Although the microlens array has been described as forming a part of the projection system PL, it could equally well be separate from the projection system PL.

CONCLUSION

While various embodiments of the present invention have been described above, it should be understood that they have been presented by way of example only, and not limitation. It will be apparent to persons skilled in the relevant art that various changes in form and detail can be made therein without departing from the spirit and scope of the invention. Thus, the breadth and scope of the present invention should not be limited by any of the above-described exemplary embodiments, but should be defined only in accordance with the following claims and their equivalents.

It is to be appreciated that the Detailed Description section, and not the Summary and Abstract sections, is intended to be used to interpret the claims. The Summary and Abstract sections can set forth one or more but not all exemplary embodiments of the present invention as contemplated by the inventor(s), and thus, are not intended to limit the present invention and the appended claims in any way.

What is claimed is:

1. A lithographic apparatus comprising:
   an array of individually controllable elements configured to provide a patterned radiation beam; and
   a projection system that projects the patterned radiation beam onto a target portion of a substrate, the projection system comprising:
   an array of lenses arranged in a plane, such that each lens in the array of lenses transmits a different part of the patterned beam, and
   an actuator system that changes a location of at least one lens with respect to other lenses such that the array of lenses is at least partially deformed from an original position such that the at least partial deformation is in a direction perpendicular to the plane of the array of lenses.

2. The apparatus of claim 1, wherein the actuator system comprises a plurality of actuators.

3. The apparatus of claim 1, wherein the actuator system comprises at least one piezoelectric actuator.

4. The apparatus of claim 1, further comprising:
   a substrate surface location detector wherein the actuator system is configured to adjust the shape of the array of lenses based on the location of a detected substrate surface.

5. The apparatus of claim 1, wherein the array of individually controllable elements comprises an emitting portion configured to emit the patterned radiation beam.

* * * * *